United States Patent

Warren et al.

[11] Patent Number: 6,140,157
[45] Date of Patent: Oct. 31, 2000

[54] MEMORY DEVICE USING MOVEMENT OF PROTONS

[75] Inventors: William L. Warren; Karel J. R. Vanheusden; Daniel M. Fleetwood, all of Albuquerque, N. Mex.; Roderick A. B. Devine, St. Martin le Vinoux, France

[73] Assignees: Sandia Corporation; Science & Technology Corporation at University of New Mexico, both of Albuquerque, N. Mex.; France Telecom/CNET, Paris, France

[21] Appl. No.: 09/129,588

[22] Filed: Aug. 5, 1998

[51] Int. Cl.[7] .................................................. H01L 21/00
[52] U.S. Cl. ................................. 438/149; 438/3
[58] Field of Search ............................... 438/3, 149, 150, 438/151; 29/571

[56] References Cited

U.S. PATENT DOCUMENTS

| | | | |
|---|---|---|---|
| 4,322,881 | 4/1982 | Enomoto et al. | 29/571 |
| 5,830,575 | 11/1998 | Warren et al. | 438/428 |

FOREIGN PATENT DOCUMENTS 2551247  8/1983  European Pat. Off. ........ G11C 17/04

*Primary Examiner*—David Nelms
*Assistant Examiner*—Dung A Le
*Attorney, Agent, or Firm*—Gregory A. Cone

[57] ABSTRACT

An electrically written memory element utilizing the motion of protons within a dielectric layer surrounded by layers on either side to confine the protons within the dielectric layer with electrode means attached to the surrounding layers to change the spatial position of the protons within the dielectric layer. The device is preferably constructed as a silicon-silicon dioxide-silicon layered structure with the protons being introduced to the structure laterally through the exposed edges of the silicon dioxide layer during a high temperature anneal in an atmosphere containing hydrogen gas. The device operates at low power, is preferably nonvolatile, is radiation tolerant, and is compatible with convention silicon MOS processing for integration with other microelectronic elements on the same silicon substrate. With the addition of an optically active layer, the memory element becomes an electrically written, optically read optical memory element.

11 Claims, 11 Drawing Sheets

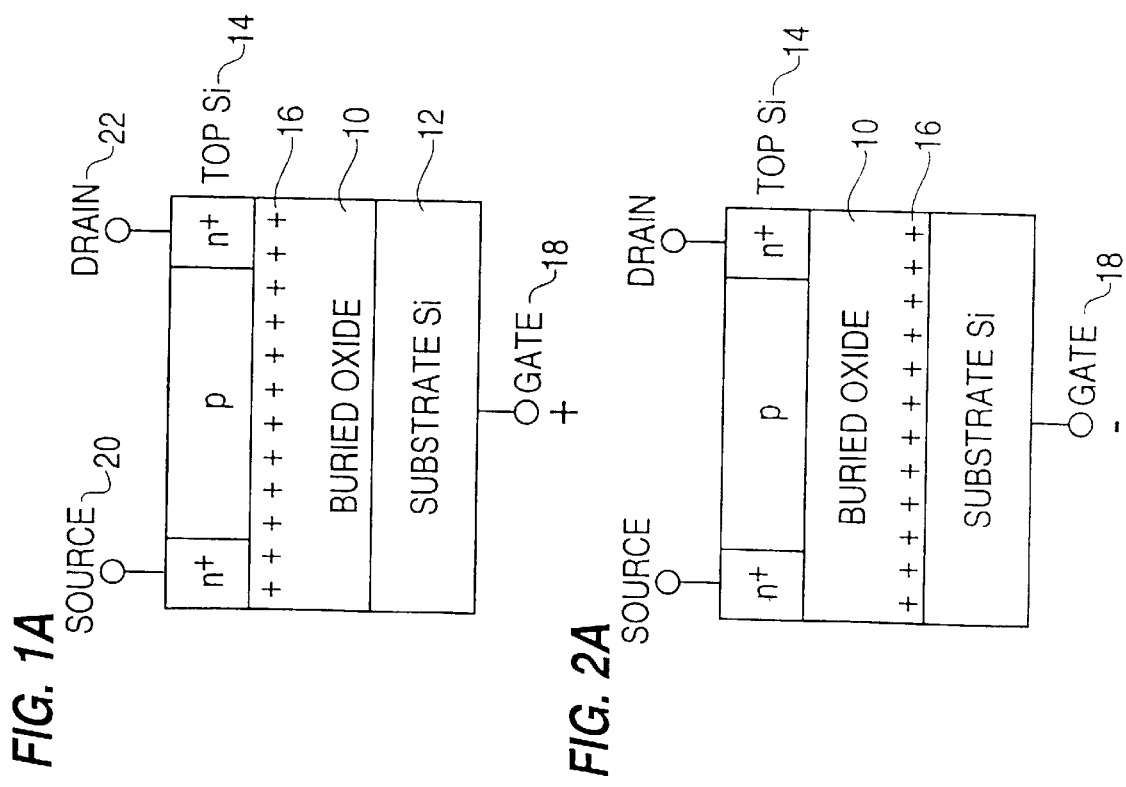

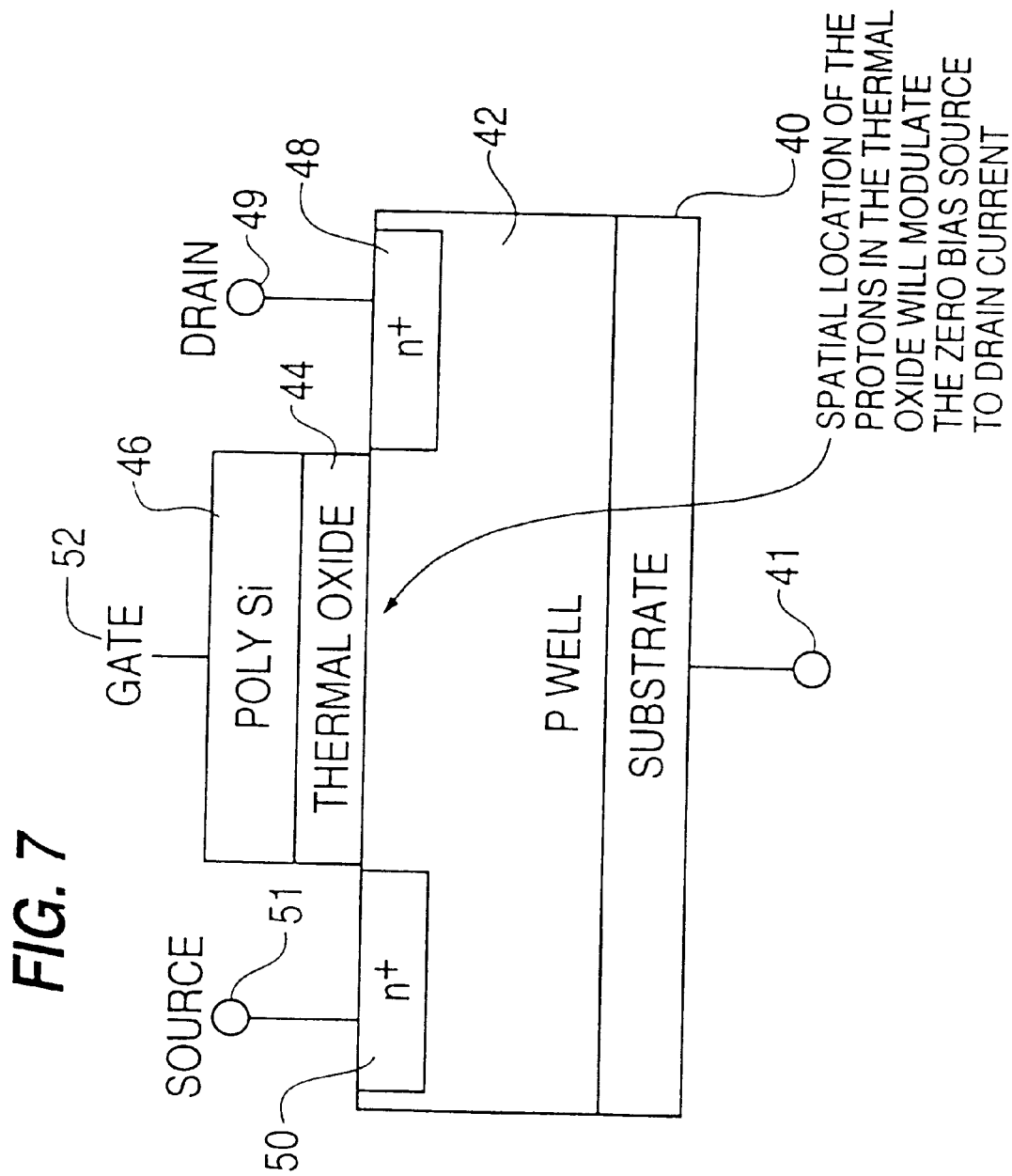

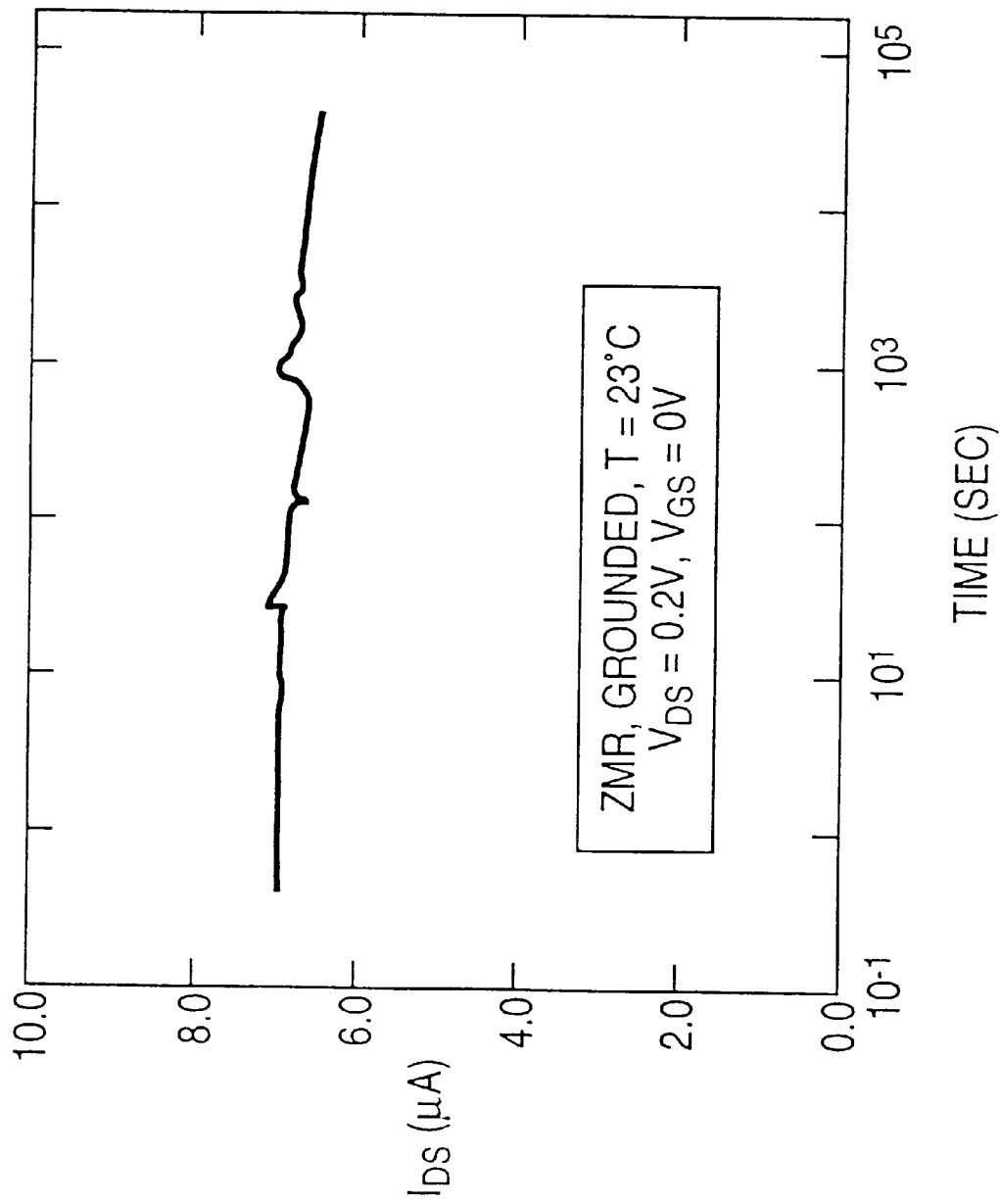

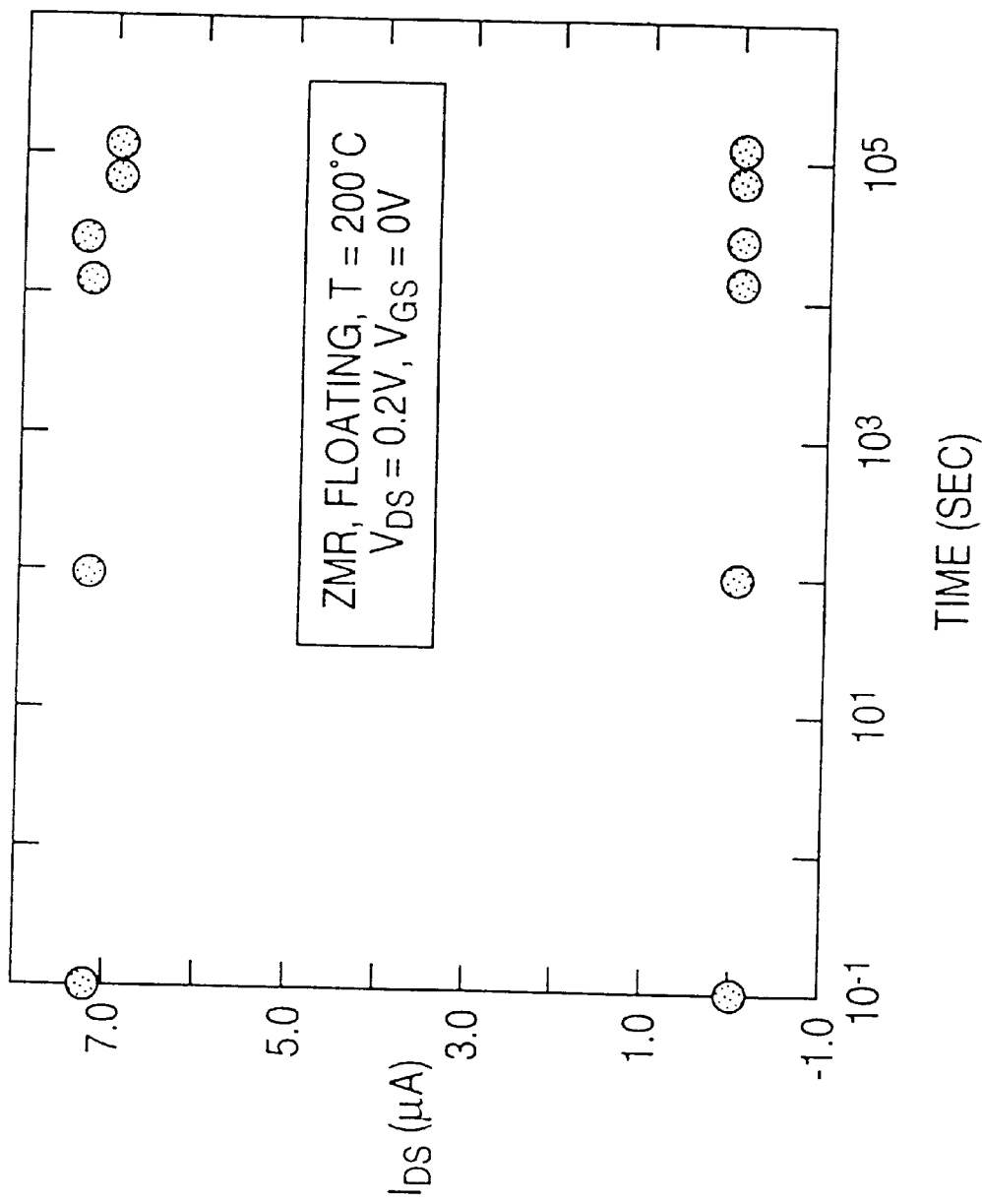

MEMORY DEVICE USING MOVEMENT OF PROTONS

This invention was made with Government support under Contract DE-AC04-94AL85000 awarded by the U.S. Department of Energy. The Government has certain rights in the invention.

BACKGROUND OF THE INVENTION

This invention relates to a new electronic memory mechanism involving the movement of protons (hereinafter hydrogenous ions) within a dielectric layer. The memory mechanism may manifest as a static random access memory, a dynamic random access memory, a nonvolatile memory, an optical memory, or as a flat panel display. The memory elements are most readily constructed in silicon-based structures.

There is a wide variety of structures that can act as memory elements. Each has its own advantages and disadvantages. The ubiquitous dynamic random access memories (DRAM) have high capacities, relatively low cost, and fast access times but are subject to upsets from radiation and other mechanisms and require refresh and rewrite circuits. Static RAMs require more circuitry and also are subject to upsets. Flash and silicon-nitride based (SONOS) nonvolatile memories have good access times and endurance but require high (12–15V) programming voltages. EEPROM nonvolatile memories have similar characteristics. Ferroelectric memories are incompatible with silicon processing but are otherwise attractive nonvolatile memories. What is needed is a low cost, silicon compatible, low voltage write/read memory that is radiation tolerant and nonvolatile with reasonable write speeds and endurance. Unfortunately no such device exists in the art at this time.

SUMMARY OF THE INVENTION

The basic mechanism exploited herein to form the memory elements of this invention is the movement of ions containing a single proton (hydrogen+, deuterium+, and tritium+—hereinafter hydrogenous ions) within a dielectric layer contained between two semiconducting or conducting layers that are impermeable to the ions. An electric field is applied reversibly across the dielectric layer to change the spatial position of the hydrogenous ions within the dielectric layer. The position of the hydrogenous ions remains the same and endures unless intentionally moved by the application of a reversed electric field across the dielectric layer. Since the protons create their own positive electric field, their spatial position within the dielectric layer. can be used to form a memory element.

When implemented as a microelectronic memory, silicon dioxide is a preferred material for the dielectric layer. The hydrogenous ions are introduced into the dielectric layer either by a high temperature anneal in a hydrogenous gas atmosphere or by implanting hydrogenous ions directly into the dielectric layer. The layers above and below the dielectric layer comprise a material that is highly imperious to the migration of the hydrogenous ions with poly or single crystalline silicon as a preferred choice. Electrodes are associated with the layers above and below the dielectric layer to create the electric field to change the spatial position of the hydrogenous ions. The state of the memory element is determined by sensing the conductivity of either of the layers adjacent to the dielectric. If the hydrogenous ions have been moved next to the interface between the dielectric layer and the adjacent semiconducting layer, the positive electric field from the ions will attract electrons from the adjacent semiconducting layer to the interface thereby changing the conductivity. When realized with silicon dioxide as the dielectric layer, the memory element is nonvolatile. When other dielectric materials are employed, the memory element can be a nonvolatile memory or a DRAM that is radiation tolerant.

When implemented as an optical memory element, an additional component is added. This is an electro-sensitive optical layer that is disposed between the upper layer and the top electrode which is now made of a transparent electrode material. The optical layer is sensitive to the spatial position of the ions and their associated electric field. An optical characteristic of the layer changes in response to the presence or absence of this field. The element would typically be formed as part of a large array of elements, each of which could be individually read by light passing completely through the element or reflecting off the side with the optical layer. The array of elements could also be configured as a flat panel display.

BRIEF DESCRIPTION OF THE DRAWINGS

FIG. 1A is a cross sectional view of one embodiment of the electronic memory element formed as a pseudo ($\psi$) MOSFET with the hydrogenous ions at the upper boundary of the oxide layer, and FIG. 1B is a simplified graph of the current voltage (I-V) characteristic of the element.

FIG. 2A is a cross sectional view of the embodiment of the electronic memory element shown in FIG. 1A with the hydrogenous ions at the lower boundary of the oxide layer, and FIG. 2B is a simplified graph of the I-V characteristic of the element.

FIG. 7 is a cross sectional view of another embodiment of the electronic memory element, here an embedded memory element for use in conjunction with non-memory elements on the same silicon substrate.

FIG. 9 is a graph showing the retention characteristic of the element of FIG. 7 at room temperature.

FIG. 10 is a graph showing the retention characteristic of the element of FIG. 7 at high temperature.

DETAILED DESCRIPTION OF THE INVENTION

Figure 3A:
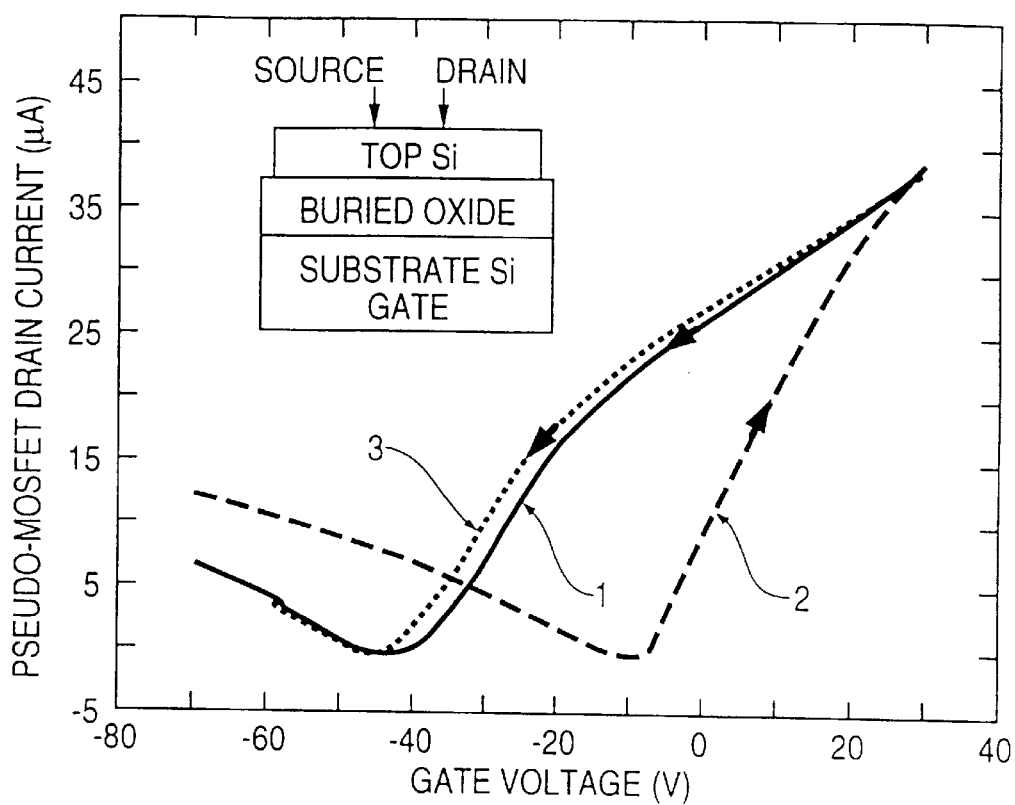
FIG. 3A is a graph of the I-V characteristic of a SIMOX $\psi$-MOSFET structure.

The effects of hydrogen ions in microelectronic devices have been studied for some time. Metal-oxide-semiconductor (MOS) devices when exposed to ionizing radiation or hot carrier stress degrade due to the creation of electrically active defects at the oxide-semiconductor interface. Many studies suggest that ionic hydrogen plays a key role in this degradation. In the course of studying these problems, the important discovery of the hystersis of the current-voltage (IV) characteristics in a dielectric layer containing such protons and surrounded by conducting or semiconducting layers was made by the inventors herein. The initial discovery was made in the course of investigating the silicon-on-insulator (SOI) material system but has since been expanded to more conventional silicon processing systems.

As was mentioned above, the fundamental proton displacement mechanism is applicable to electronic memory and also to optical memory that is optically read but electrically written. The electronic memory embodiment will be discussed first.

Electronic Memory

The mechanism embodied in an electronic memory is perhaps most readily understood by study of FIGS. 1A, 1B, 2A and 2B. FIG. 1A is a simple embodiment of the electronic memory with the oxide layer 10 surrounded by the silicon substrate 12 below and the upper p-Si layer 14 above. A gate electrode 18 is attached to the bottom of the substrate, and source 20 and drain 22 electrodes are attached to n+ regions of the upper layer 14. The mobile hydrogenous ions 16 are at the top of the oxide layer. This spatial position of the ions produces the 'ON' condition shown in the simplified I-V curve in FIG. 1B. The presence of the positively charged ions 16 attracts the mobile electrons in the p region of the upper layer 14 to the interface between layers 10 and 14, thereby creating a conducting channel at the base of the upper layer 14 so that current will easily pass between the source and drain electrodes. FIG. 2A shows the same device with the hydrogenous ions 16 now moved to the bottom of the oxide layer 10. In this position the electric field created by the ions is no longer strong enough to create the conductive channel in the upper layer 14. This produces the 'OFF' condition shown in the I-V curve in FIG. 2B. The ions 16 are moved by placing the voltage biases shown on the gate electrode 18 as shown in FIGS. 1A and 2A. These devices could also be fabricated with p+ regions at the source and drain electrodes.

Figure 3B:
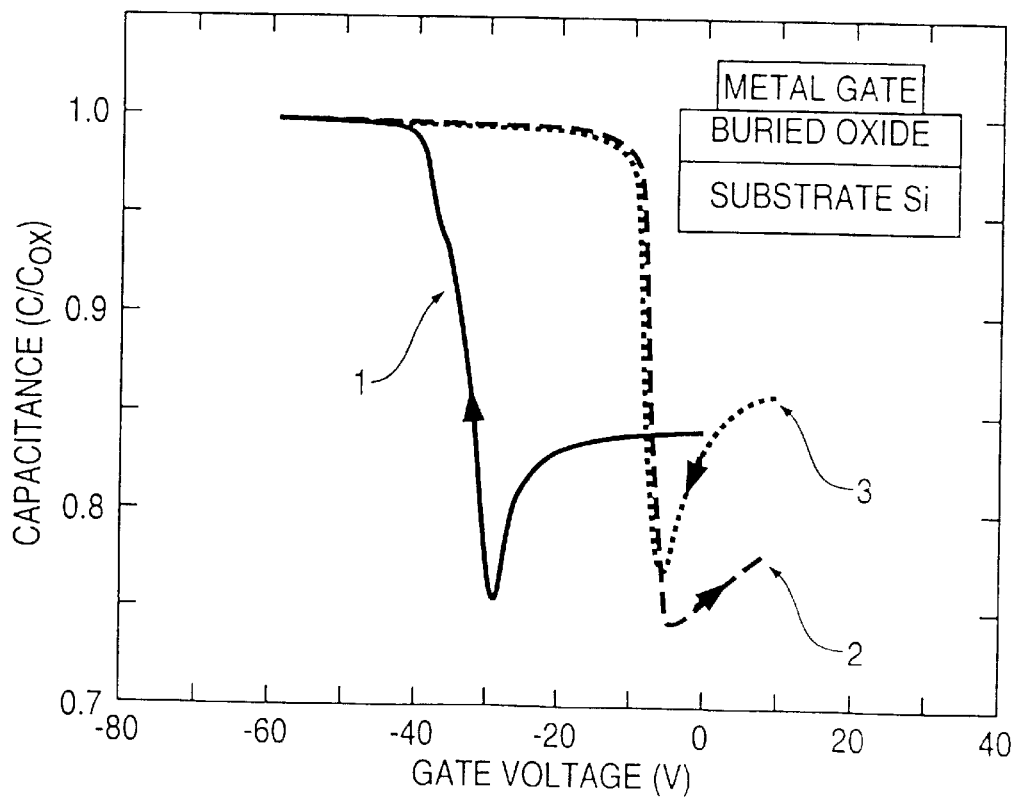
FIG. 3B is a graph of the C-V characteristic of an MOS capacitor, as shown in the respective inserts.

The initial devices created to demonstrate the invention were formed in $Si/SiO_2/Si$ structures. H+ (D+) ions were introduced into the buried $SiO_2$ layer by annealing the structure in a hydrogen (deuterium) containing atmosphere. The spatial position of the ions in the oxide layer was monitored by high frequency capacitance voltage and current voltage measurements (FIGS. 3A and 3B). The reversibility and transient behavior of the proton and deuteron migration inside the oxide layer was studied as a function of gate bias across the oxide at different temperatures and demonstrated that the ions created by the introduction of the hydrogenous gas were responsible for the hysteresis effects observed.

Three different types of $Si/SiO_2/Si$ materials were investigated. Separation by the implantation of oxygen (SIMOX) samples were formed by implanting ap-type Si(100) substrate with 190-keV $O^+$ ions to a dose of $1.8 \times 10^{18}$ $cm^{-2}$ followed by a subsequent anneal at 1320° C. in Ar+1% $O_2$. This resulted in a 200-nm monocrystalline Si (c-Si) layer on top of a 400-nm buried oxide layer, so the oxide layer is sandwiched between two c-Si layers. Zone-melt-recrystallization (ZMR) SOI wafers, p-type (100) Si material, with a 330-nm monocrystalline Si layer on top of a 1-$\mu$m-thick buried oxide layer, were also investigated. Apart from these two SOI materials we also studied a standard thermal $SiO_2$ (40-nm thick) capped with an undoped poly-Si layer (1-$\mu$m thick), chemical-vapor- deposited and annealed at 1200° C. for 2 h in Ar +1% $O_2$.

Part of the top Si layer of the wafers was etched in a $HNO_3$-$CH_3COOH$-HF mixture through a mask, leaving behind isolated rectangular strips (2 mm by 9 mm) of top Si layer. This was done to reduce leakage currents at the substrate edges and through the buried oxide layer during the subsequent point contact pseudo-metal-oxide-semiconductor-field effect-transistor ($\psi$-MOSFET) measurements, and to facilitate lateral diffusion of hydrogen (deuterium) into the buried oxide during the forming gas anneal. This lateral diffusion is crucial because the amount of hydrogen diffusing through the top c-Si layer into the buried oxide is negligible, due to the very low solubility of hydrogen in Si.

Forming-gas (FG) [$N_2:H_2$; 95:5 or $N_2:D_2$; 95:5 (by volume, 99.999% pure)] and nitrogen (99.999% pure) anneal treatments were performed using a flow through a quartz tube inserted into a tube furnace between 300 and 900° C. for 30 min. For the capacitance-voltage (C-V) measurements, the Si strips were etched off using KOH. C-V measurements on the $Si/SiO_2$ structures resulting from the KOH etch were made at 1 MHz with a mercury probe or Al dots ($\approx$1 $mm^2$ contact area) forming gate contacts.

Current-voltage (I-V) measurements on the $Si/SiO_2/Si$ structures were performed using the point-contact $\psi$-MOSFET technique. The buried oxide plays the role of the gate dielectric and the top Si layer represents the transistor body. Two tips of a standard four point probe are placed on the top Si layer to form the source and drain point contacts, while the gate voltage is applied to the back of the Si substrate.

FIG. 3A shows the hysteretic behavior of the I-V curves on SIMOX after it received a 550° C. FG anneal. Similar features were observed in the ZMR and the poly-Si capped thermal oxide, and occur over a FG-anneal temperature range from 500 to 800° C. Curve 1 was recorded with a decreasing gate (substrate) bias (from positive to negative) after the bias was kept constant at the initial value (+40 V) for 5 minutes. Curve 2 was subsequently recorded using the opposite gate voltage sweep direction (from negative to positive) after holding the gate bias at the initial value (−70 V) for 5 min. The "hysteretic" behavior is evidenced by the fact that the original I-V curve (curve 1) was not retraced by reversing the voltage sweep direction (curve 2). Curve 3 was recorded after curve 2 using the same procedure described for curve 1, showing the reversibility of the process.

In general, charge in the oxide will cause the I-V curve to shift along the voltage axis. This voltage shift ($\Delta V$) is proportional to the charge density and depends on its spatial distribution in the SiO$_2$ layer:

$$\Delta V = -\frac{e}{\varepsilon}\int_0^d x\rho(x)dx \quad (1)$$

where e is the electronic charge, d is the oxide thickness, $\varepsilon$ is the oxide dielectric constant, and $\rho(x)$ is the local charge density in the dielectric. For the MOS capacitors, the variable "x" is the distance between the local oxide charge r(x) and the metal gate; for the $\psi$-MOSFET, x is the distance between the charge and the substrate-Si/SiO$_2$ interface. As can be seen from the integral in Eq. 1, $\Delta V$ is maximized for the $\psi$-MOSFET if the charge is located near the top-Si/SiO$_2$ interface (x≈d) and is minimized if it is located near the substrate-Si/SiO$_2$ interface (x≈0). The negative voltage shifts $\Delta V$ in the I-V plots are caused by positive charges in the buried SiO$_2$ (areal density ≈2×10$^{12}$ cm$^{-2}$). The observed hysteretic behavior is the result of an electric field induced migration of a charged ionic species from one Si/SiO$_2$ interface to the other. This type of behavior was not observed after annealing in Ar or N$_2$, showing that the presence of hydrogen in the anneal ambient triggers the hysteretic behavior; it is not due to mobile ion contamination.

If the top Si layer is removed and an MOS capacitor is formed, it is observed that the charged species escape the SiO$_2$ dielectric through the metal gate under negative gate bias. This further demonstrates that the mobile species involved are positively charged. The crucial role of the hydrogen anneal step to trigger the hysteretic effect, and the much higher solubility of hydrogen and reaction in metal capacitor gates such as Al or Hg as compared to Si, collectively suggest that the mobile charge is H+.

The transient behavior of the field induced charge migration from an accumulated interfacial layer into the bulk of the buried SiO$_2$ layer was analyzed as a function of different gate voltages ($V_G$) and temperatures. This was done by first applying a positive $V_G$ to the substrate of Si/SiO$_2$/Si device structures, which causes positive ion accumulation in a thin layer at the top-Si/SiO$_2$ interface (areal density $Q_H^+$). After this, the polarity of $V_G$ was reversed, forcing the ions to migrate away from the accumulated layer into the bulk of the SiO$_2$. The exodus of ions away from the charge layer accumulated at the top-Si/SiO$_2$ interface, induced by the applied $V_G$, is well described as space-charge-limited current. Space charge limited current flows when mobile charge carriers are injected into an insulator, where no other charges are present. Solving Poisson's equation for this problem yields:

$$\frac{\mathbb{D}Q_H^+}{\mathbb{D}t} = J_{H^+}\mu\frac{V_G^2}{d^3}m_{H^+}, \quad (2)$$

where $$\frac{\mathbb{D}Q_H^+}{\mathbb{D}t}$$

is the rate of decrease in the charge density accumulated at the top-Si/SiO$_2$ interface, $J_H^+$ is the space charge limited ionic current density in the SiO$_2$ layer, and $\mu_H^+$ is the ionic mobility.

When the positive ionic charge, $Q_H^+$, is accumulated at the top-Si/SiO$_2$ interface in a $\psi$-MOSFET structure it will induce a negative threshold voltage shift, $\Delta V$, in the transistor characteristics. As a result, an inversion channel is formed in the p-type top Si layer at the top-Si/SiO$_2$ interface, and a drain current ($I_D$) will flow in the $\psi$-MOSFET device. We will assume a linear relationship between $Q_H^+$ and the resulting threshold voltage shift $\Delta V$ at the top-Si/buried-SiO$_2$ interface at any time during the field induced ionic drift. This is only an approximation since the exact expression for the threshold voltage shift involves integration over the entire oxide layer as described in Eq. 1. We will also assume a linear relationship between $\Delta V$ and the $\psi$-MOSFET drain current $I_D$ at any gate voltage $V_G$ smaller than the voltage shift $\Delta V$. As can be seen from FIG. 3A this appears to be a reasonable approximation. Consequently, the decrease in $Q_H^+$ as a function of time after switching the gate bias polarity, $$\frac{\Delta Q_H^+}{\Delta t},$$

can be measured as a decrease in $I_D$ over time $$\left(\frac{\Delta I_D}{\Delta t}\right).$$

Figure 4A:
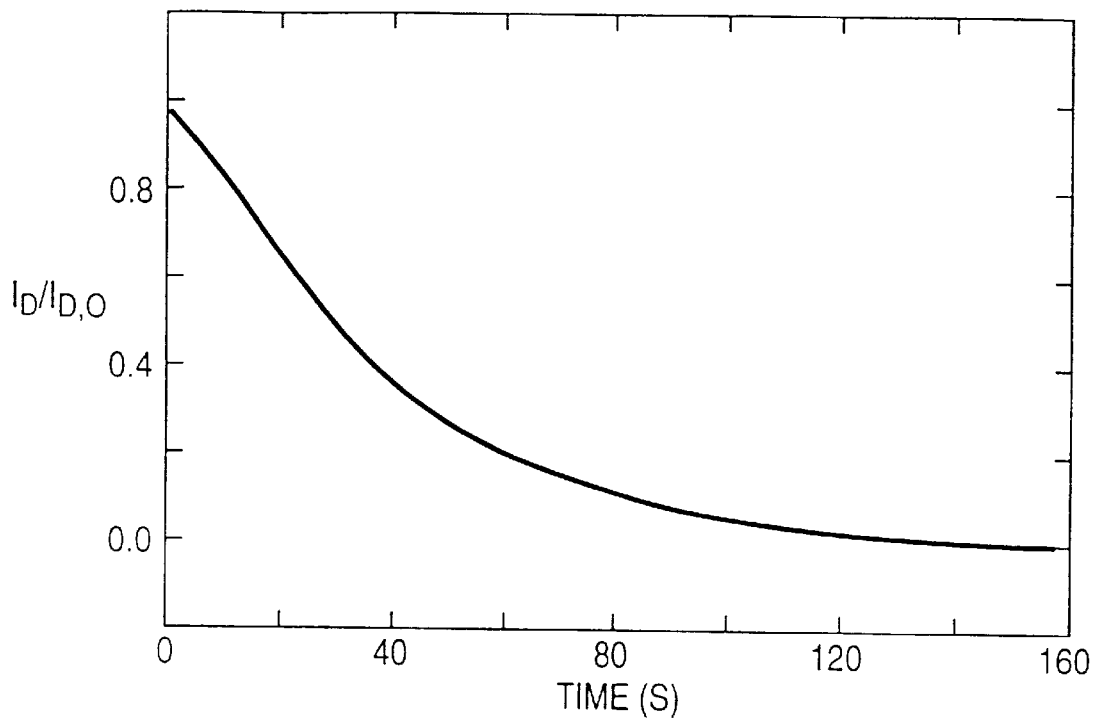
FIGS. 4A and 4B show, respectively, drain current decay and a cross sectional schematic representation of the migration of the hydrogenous ions causing the decay.
Figure 4B:
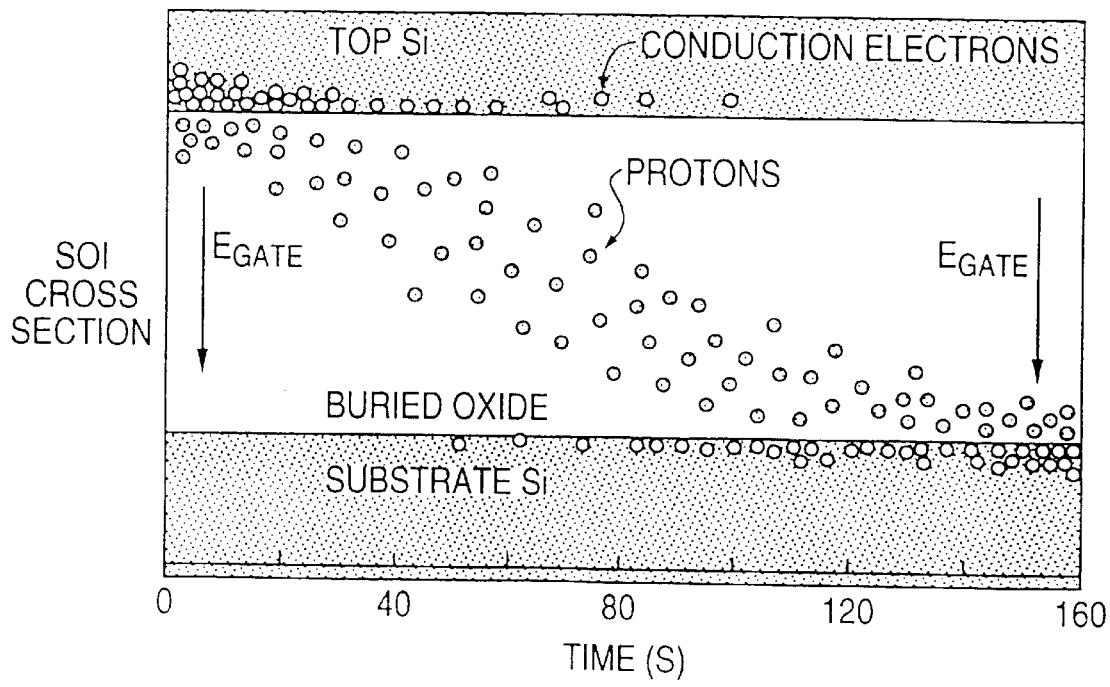

FIG. 2(a) shows the decay of $I_D$ vs. time in a $\psi$-MOSFET device on FG-annealed ZMR material. The positive ions were first drawn to the top-Si/SiO$_2$ interface with a $V_G$=+60 V substrate bias, followed by switching to $V_G$=−10 V and maintaining the substrate at 73° C. The schematic in FIG. 4B shows an SOI cross section, with the evolution of the conduction electrons in the top-Si inversion layer and the ionic distribution, on the same time scale as FIG. 4A. The initial rate of decay of the $\psi$-MOSFET drain current $$\frac{\Delta I_D}{\Delta t}$$

obtained from the $I_D$ vs. t curves such as the one shown in FIG. 4A was also analyzed. The $V_G$ dependence was measured by switching to different negative $V_G$ after first accumulating the ions at the top-Si/SiO$_2$ interface. It was found that the electric field dependence of the initial decay rate is well described by a square-law behavior as anticipated from Eq. 2. It should be noted that the relatively high voltage employed and the relatively long time scale are a function of the relatively thick oxide layer tested here.

To first order, the ionic mobility in Eq. 2 is governed by a thermally activated hopping process and is given by:

$$\mu = \frac{qa^2\nu}{6k_BT}\exp\left(\frac{-E_a}{k_BT}\right), \quad (3)$$

where q is the ionic charge, a is the intersite hopping distance, $E_a$ is the activation energy, $k_B$ is Boltzmann's constant and T is the absolute temperature. The parameter $$\nu = \sqrt{\frac{\Phi''}{m}}$$

is the attempt to escape frequency, in which $\Phi''$ is the second derivative of the function describing the potential-well of the hopping site, and m is the mass of the ionic species. Hopping simply implies that the ion moves through the lattice by consecutive jumps (hops) from one site to another, and that the ion must have enough energy (>$E_a$) before the jump can occur with any reasonable probability.

Figure 5:
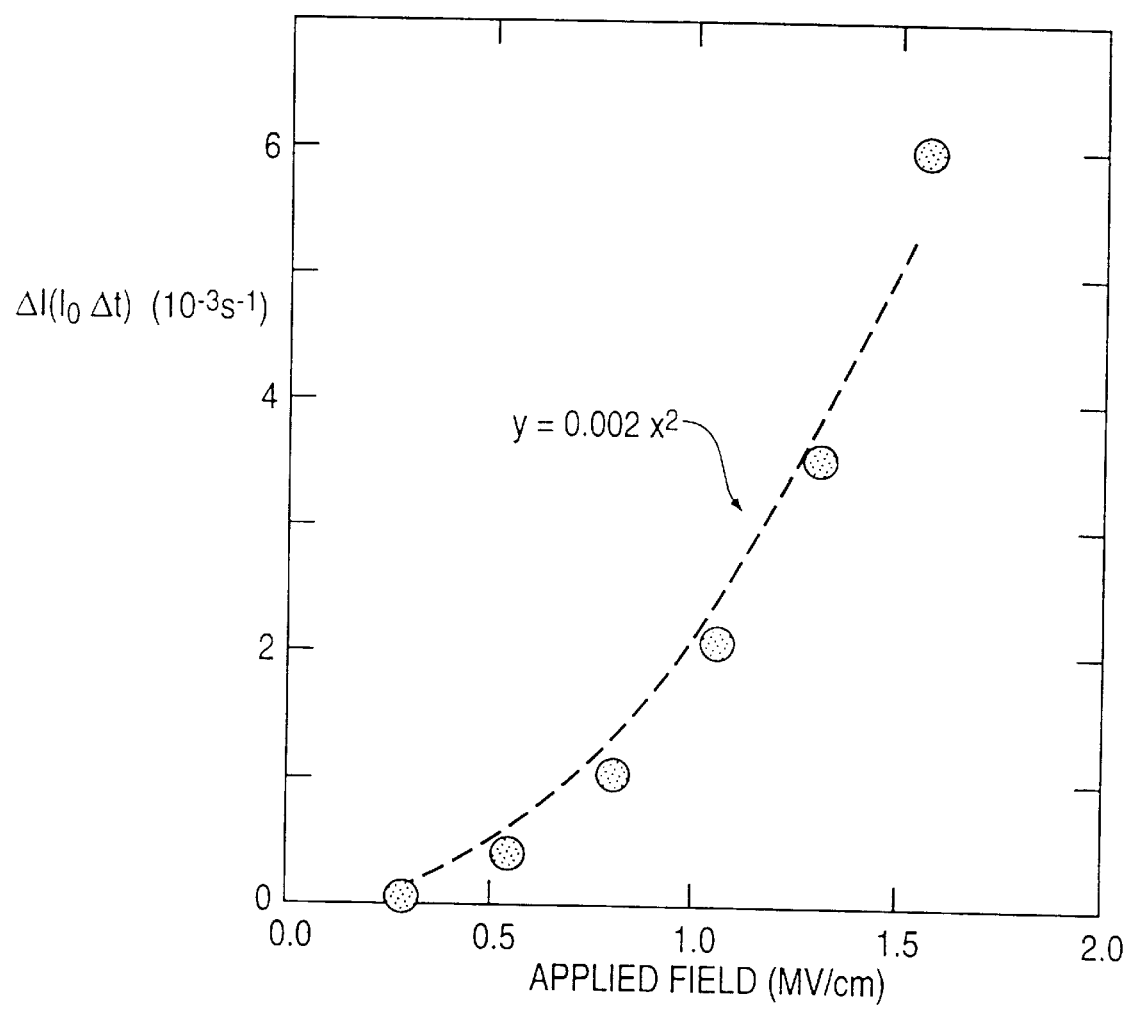
FIG. 5 is a graph showing initial rate of decay of drain current as a function of gate bias. Each data point represents the initial slope of the I-t curves of FIG. 4A. Different I-t curves were obtained by first applying a +60 V substrate bias for 5 minutes to accumulate the ions at the interface between the oxide layer and the upper Si layer, followed by switching to different negative substrate biases. The dashed line is a $y=ax^2$ least squares fit to the data (a=0.002).
Figure 6A:
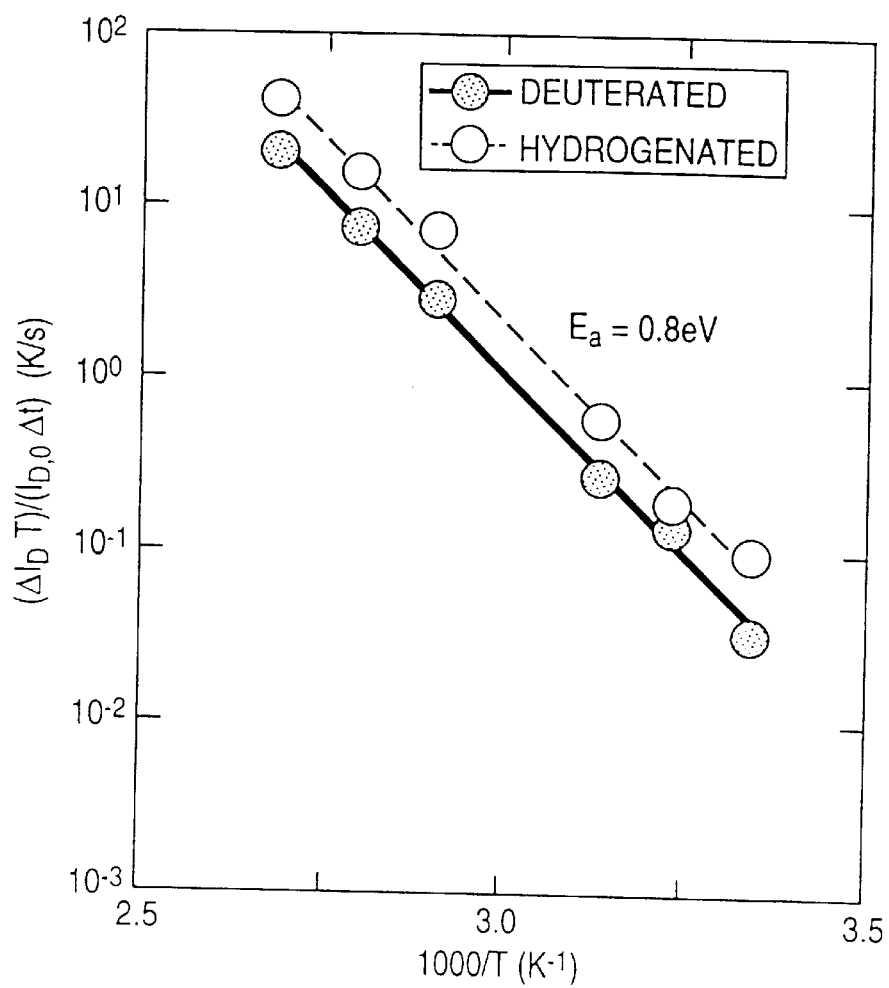
FIG. 6A is an Arrhenius plot of the initial rate of decay of the normalized drain current. The data were taken as in FIG. 5 by first applying a +60 V substrate bias for 5 minutes, but now followed by switching to −10 V substrate bias at different substrate temperatures.
Figure 6B:
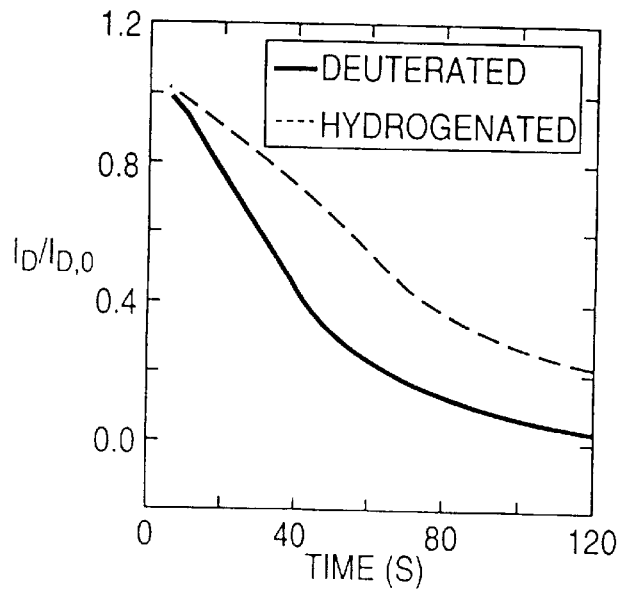
FIG. 6B shows the normalized decay of the drain current vs. time at 730° C.

To determine $E_a$ for H⁺ motion, the initial rate of decay of the ψ-MOSFET drain current $$\frac{\Delta I_D}{\Delta t}$$

in FG-annealed ZMR devices was again measured in the same way as described above, except that the temperature was varied at a fixed $V_G$ (−10 V). FIG. 5 shows the Arrhenius plot of $$\frac{\Delta I_D T}{\Delta t}$$

vs. $T^{-1}$ (see Eqs. 2 and 3) measured on Si/SiO₂/Si (ZMR) structures that were hydrogenated or deuterated at 600° C. From this plot, we deduce an activation energy $E_a \approx 0.8$ eV for the ionic mobility for both the hydrogenated and deuterated buried $SiO_2$. This value is in good agreement with the diffusion activation energy of H⁺ in standard thermal $SiO_2$ thin films. The difference in absolute values between the two curves in FIG. 6A and 6B results from a difference in the prefactor of Eq. 3 of 1.5, again in good agreement with the theoretically expected difference of $$\sqrt{\frac{m_D}{m_H}} = \sqrt{2}.$$

This observed hysteretic behavior can be utilized in a non-volatile NVFET memory device. An n-channel transistor can be changed to "normally on" or "normally off" by applying a positive or negative gate (substrate) bias which will drift the protons to the top Si/SiO₂ or substrate Si/SiO₂ interface, respectively. For a memory device this can be interpreted as writing the device to a bit state "1" or "0", respectively. To read the device, the zero bias drain current $I_0$ is simply measured (high current then corresponds to logic state "1", low current to "0"), as visualized in FIGS. 1, 2, 3 and 4. In contrast with the instabilities that are usually associated with mobile ions in $SiO_2$, charge retention experiments on this device show that once written to a specific state, the device remains in that state for over $10^4$ s while heated to 200° C. Furthermore, fatigue experiments performed on these structures show that the device easily endures over $10^4$ write-erase cycles without any degradation.

For memory devices, a short write time is desirable. For the device used in FIG. 4 the write time would be about 100 s. It follows from Eq. 2 that the device speed is proportional to $d^{-3}$, where d is the buried oxide thickness. For devices fabricated using the poly-Si-capped 40-nm thermal oxide substrate as shown in FIG. 7, a write time of about 30 ms was observed at room temperature, in good agreement with the $d^{-3}$ dependence predicted from theory. Write times as fast as 1 ms can be expected for 10-nm thermal oxides. Even more significantly, the latter result demonstrates that these non-volatile field effect transistor (NVFET) memory devices do not require SOI substrates, but can be fabricated using thermal oxides capped with a poly-Si layer, a standard procedure in Si-MOS processing.

Figure 8:
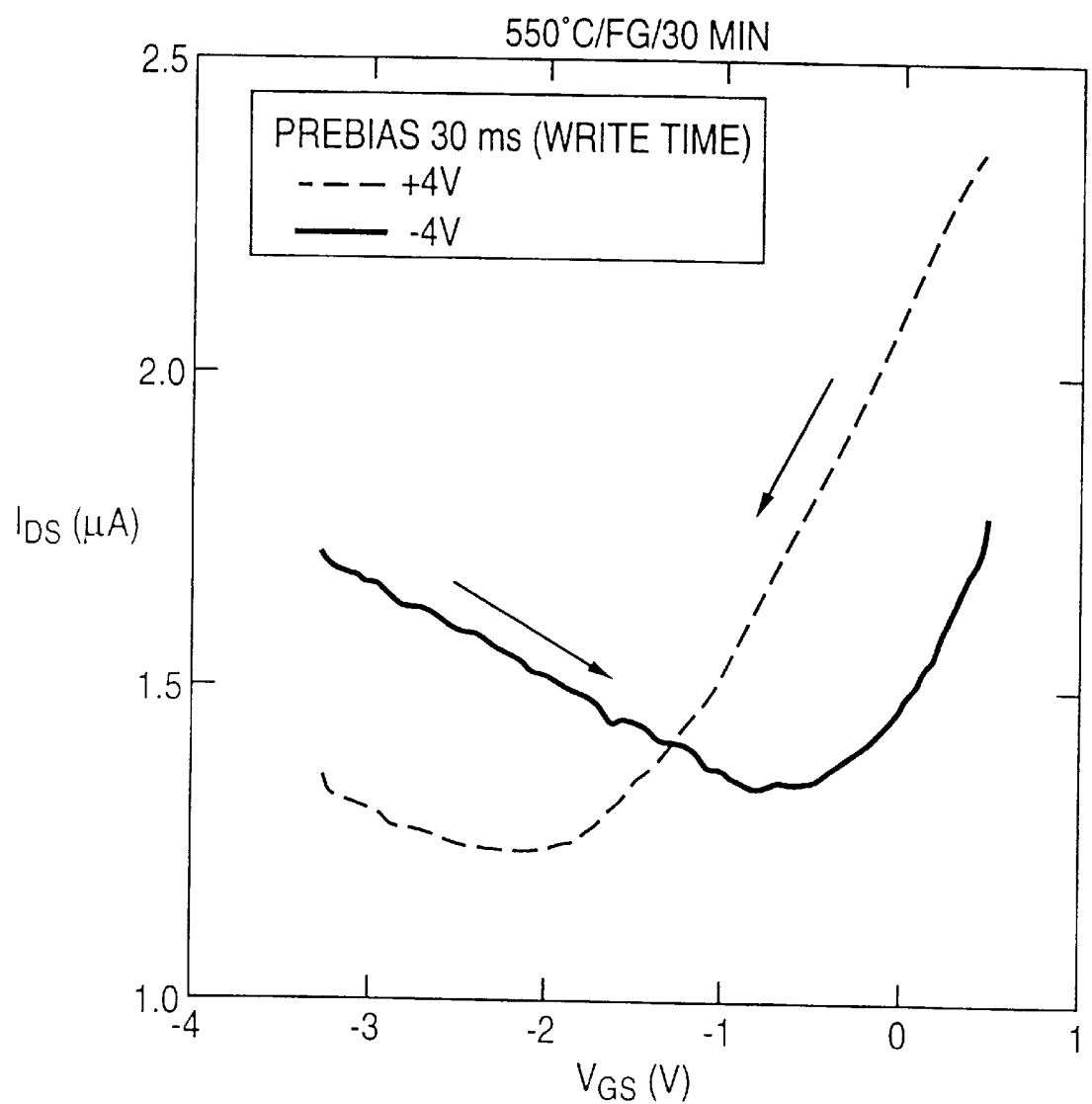
FIG. 8 is a graph of the measured I-V characteristic for the element of FIG. 7.

Turning to FIG. 7 for more detail on this alternative device, a p-type layer 42 is formed on a silicon substrate 40. An oxide layer 44, which can be either a thermal oxide layer or a deposited oxide layer, is formed on top of the p-type layer 42 and capped by a polycrystalline silicon layer 46. The hydrogenous ions are introduced into the oxide layer at this point, either by annealing in a hydrogenous gas atmosphere or by ion implantation. The n+ drain 48 and source 50 regions are formed, and finally the various electrodes are formed. To write the device, normally substrate 41, source 51, and drain 49 electrodes would be connected to ground with the gate electrode being biased positively or negatively to change the spatial position of the hydrogenous ions. FIG. 8 is a graph showing the I-V characteristic of the device of FIG. 7, where the ions were formed in the oxide layer by a 30 minute anneal at 550° C. informing gas. This device could also be fabricated with p+ regions about the source and drain electrodes.

This NVFET device has potential advantages over state-of-the-art non-volatile memory technologies such as Flash and EEPROM. While its speed, retention and lifetime performance are certainly competitive with these existing technologies, it is simpler in design, requires fewer processing steps, operates at much lower voltages.

Finally, we discuss the mechanism causing the incorporation of mobile H⁺ ions in the buried $SiO_2$ layer of these Si/SiO₂/Si materials during the FG anneal. It is known that the high-temperature (1200–1325° C.) formation anneal step creates neutral O vacancies (Si—Si bonds) in the buried oxide via O out-diffusion from the $SiO_2$ into the top and substrate Si layers. Because these strained Si—Si bonds can act as H₂ cracking sites in the buried $SiO_2$, they are catalyst sites for the generation of protons at elevated temperature. Since the solubility of hydrogen species in c-Si is low, once formed, the H⁺ is largely "imprisoned" in the buried $SiO_2$ layer, sandwiched between the two encapsulating Si layers, i.e., the interfaces form a diffusion barrier for hydrogen. While there seems to be a peculiar affinity between $SiO_2$ and the hydrogenous ions that provides the excellent characteristics for nonvolatile memory, the scope of the invention is intended to encompass any material which provides similar behavior with hydrogenous ions.

These cracking sites form naturally by the high temperature annealing process as the O from the silicon dioxide structures in the oxide diffuse across to the pure silicon regions in the layers on either side. As the O migrates away, Si—Si bonds are created in the oxide layers that form the cracking sites. However, these Si—Si bonds may also be created deeper within the oxide layer by implanting Si ions into the oxide layer to form the cracking sites. Once the cracking sites have formed, one should avoid further prolonged long duration high temperature processing steps for the devices. Short duration processes such as Al metallizations at 450° C. or lower are permissible, but higher temperatures should be avoided.

The silicon layers above and below are essentially impermeable to these ions. However, there may be some devices that require that a layer other than silicon be emplaced next to the central dielectric layer. This material must also act to confine the hydrogenous ions within the dielectric layer. Suitable materials include, but are not limited to, nitrides, nitrided oxide, silicon nitride, and polycrystalline and monocrystalline silicon. Once the structure has been annealed and the ions created, the ions tend to remain within the oxide layer and gaps in the surrounding impervious confining material can be tolerated. FIGS. 9 and 10 illustrate the excellent retention characteristics of the silicon dioxide devices.

Figure 11A:
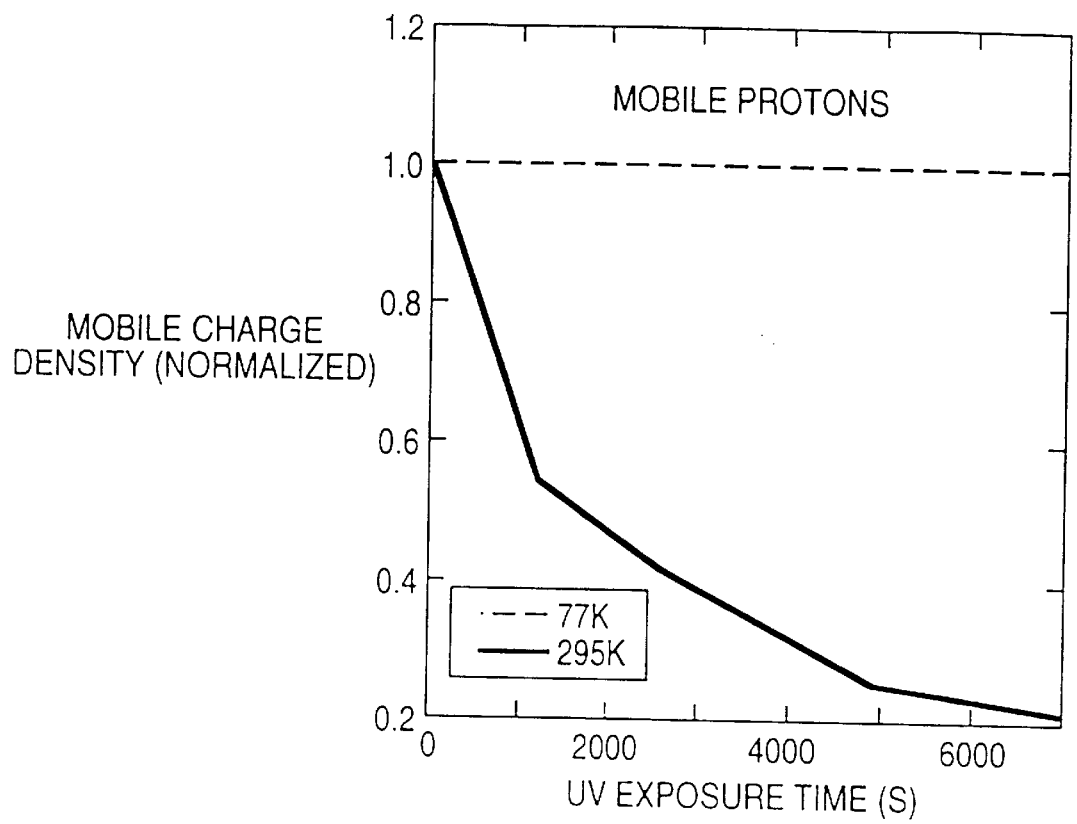
FIGS. 11A and 11B are endurance and radiation tolerance response graphs for a memory element of this invention and a conventional electronic memory element, respectively.
Figure 11B:
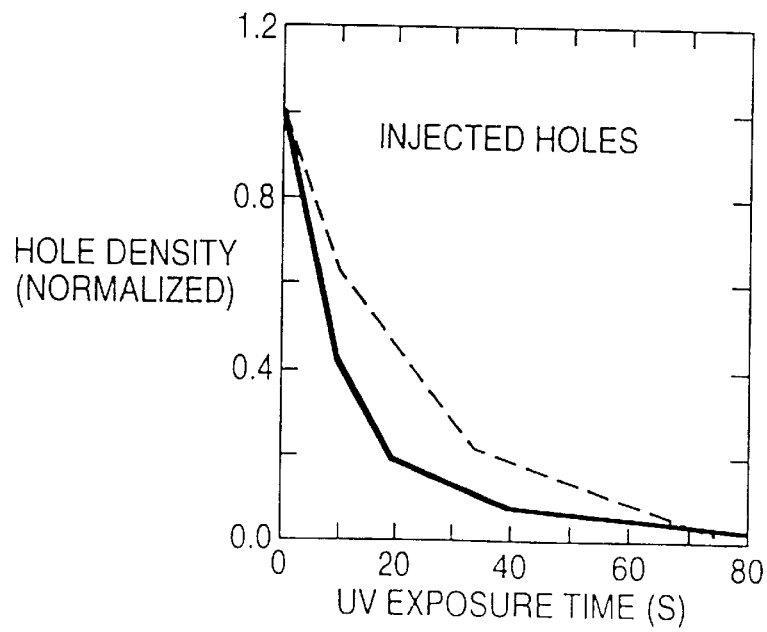

The hydrogenous ions present small capture cross-sections to electrons and, as such, enable these devices to be radiation tolerant. Further experimentation may extend this property to the radiation hard level. FIGS. 11A and 11B compare, respectively, a typical device of this invention with a typical prior art nonvolatile memory on the basis of mobile charge density vs. time of exposure to radiation, demonstrating that the protons have much longer endurance than holes.

The above examples have discussed structures formed by SIMOX processing and conventional silicon MOS processing techniques. Other processes may be employed to form the memory elements including but not limited to zone melt recrystallization (ZMR), UNIBOND® processing, and bonded and etchback silicon on insulator (BESOI).

Optical Memory

The above described electronic memory elements can also be used to create optical memory elements that are electrically written and erased and optically read. The basic functional element of the dielectric layer containing the mobile hydrogenous ions flanked by layers that confine the ions remains and is combined with the added component of an optically active layer that is sensitive to the proximity of the electric field created by the mobile ions. This optical layer could be a transparent piezoelectric layer whose refractive index changes with the electric field or a liquid crystal layer whose polarization changes with the electric field or other materials with the same or other optical properties affected by the electric field of the mobile ions.

Figure 12:
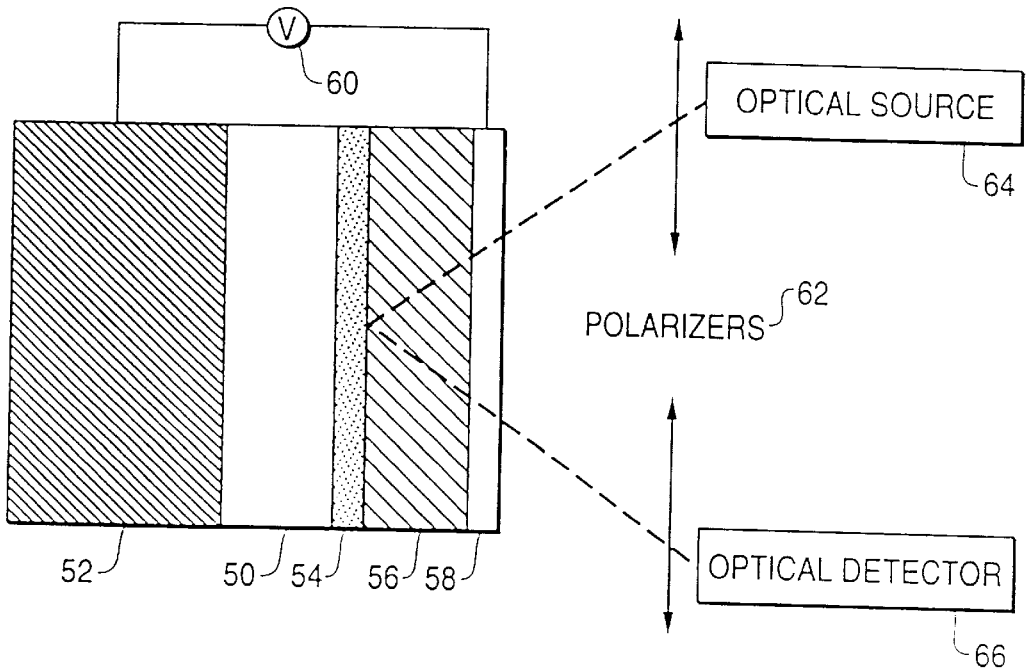
FIG. 12 is a cross sectional view of an optical memory element used reflectively.

FIG. 12 is a view of a reflective embodiment of the optical memory element. The dielectric layer 50 is surrounded by a back side layer 52, typically a silicon substrate, and by a front capping layer 54, typically a thin silicon layer. The optically active layer 56 located between the front capping layer 54 and a transparent electrode layer 58, preferably tin oxide or indium tin oxide. The mobile hydrogenous ions are introduced into the dielectric layer as discussed above and prior to formation of the optical layer 56. Light from an optical source 64 passes through the first polarizer 62, enters the optical layer 56, here a liquid crystal with a polarizing effect upon the light. The light leaves the element, and passes through another polarizer 62 to reach an optical detector. If the mobile hydrogenous ions have been moved close to the front capping layer 54, the liquid crystal layer 56 will be in one polarization state; and, if the ions have been moved away from the front capping layer 56, the liquid crystal will be in another polarization state. The particular polarization state the optical memory element is in will determine whether light transmitted from the source 64 will reach the detector 66. If the optical layer were a piezoelectric material, the polarizers 62 would not be needed. Instead, the refractive index of the optical layer 56 would change and the exit beam would be angularly displaced either onto or away from the fixed detector in this alternate embodiment.

Figure 13:
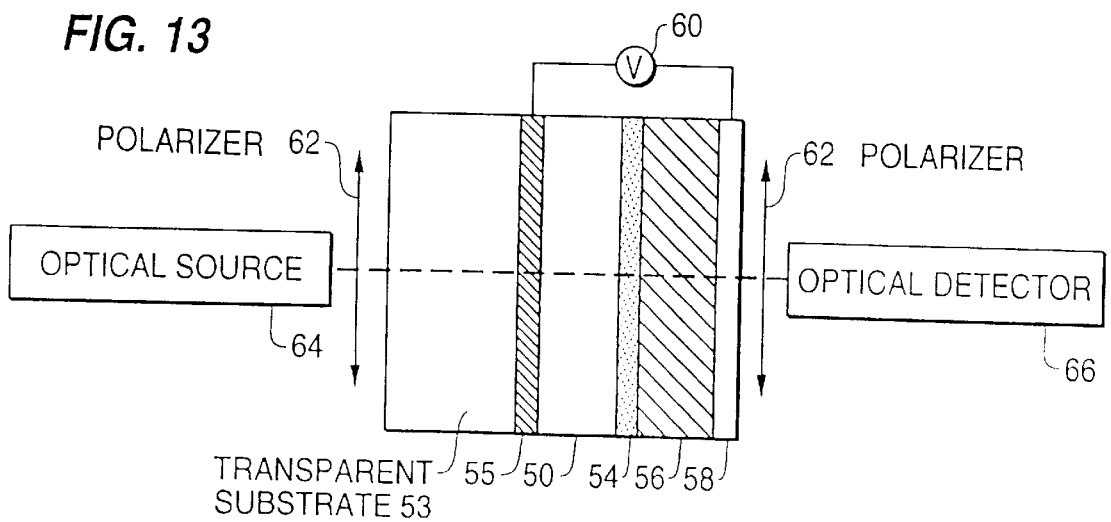
FIG. 13 is a cross sectional view of an optical memory element used transmissively.

FIG. 13 is a view of a transmissive embodiment of the optical memory element. The differences between this embodiment and the embodiment of FIG. 12 are that there is an additional transparent substrate layer 53 typically made of quartz or glass, with a thin silicon layer 55 serving as a rear capping layer to confine the mobile hydrogenous ions on the back side of the dielectric layer 50, here silicon dioxide. As this is a transmissive element, the optical source 64 has been moved to the back side of the element along with one of the polarizers 62. The operation is otherwise similar to that discussed above for the liquid crystal embodiment and for the piezoelectric material embodiment.

If the individual optical memory elements were combined into a large array with individually electrically written elements, the array would become a large scale memory array or, with suitable redesign, the basis for a flat panel display.

What is claimed is:

1. A process for making a memory element comprising:

forming a first dielectric layer to contain mobile hydrogenous ions between a lower layer and an upper layer located on either side of the first layer, the lower and upper layers being essentially impervious to migration of hydrogenous ions therethrough;

populating the first layer with mobile charged hydrogenous ions; and forming electrode means on the lower and the upper layers to create a reversible electric field across the first layer for the purpose of moving the hydrogenous ions across the first layer.

2. A process to form a microelectronic memory element comprising:

implanting oxygen ions into a silicon substrate;

annealing the implanted silicon substrate to form a layer of silicon dioxide beneath the upper surface of the substrate with the uppermost portion of the substrate being a silicon layer;

opening windows in the upper surface of the substrate to expose the silicon dioxide layer;

annealing the substrate in an atmosphere containing a hydrogenous gas to introduce hydrogenous ions into the silicon dioxide layer; and forming electrode means on the bottom of the silicon substrate and above the silicon layer for connection to reversible voltage bias means for the purpose of moving the hydrogenous ions across the silicon dioxide layer in response to the reversible voltage bias means.

3. The process of claim 2 additionally comprising forming a first zone in the silicon layer at the upper surface of the substrate of a first conductivity type above the silicon dioxide layer and forming two second zones of the first or a second conductivity type in the silicon layer at the upper surface of the substrate on either side of the first zone such that the electrode means on the upper surface are realized as two electrodes, each contacting one of the second zones to form source and drain electrodes with the electrode means on the bottom of the substrate forming gate electrode means for the memory element.

4. The process of claim 3 wherein the first conductivity type is p type and the second conductivity type is n type.

5. A process for forming a microelectronic memory element comprising:

forming a first region of a first conductivity type on the upper surface of a silicon substrate;

forming a layer of silicon dioxide above the first region;

forming a layer of polycrystalline silicon over the silicon dioxide layer to prevent escape of the hydrogenous ions from the silicon dioxide layer;

creating a gate region in the polycrystalline silicon layer by masking the gate region, etching away the polycrystalline silicon except where the mask protects it, and removing the mask;

introducing mobile hydrogenous ions into the silicon dioxide layer;

forming two second regions of the first or a second conductivity type on either side of the silicon dioxide;

forming electrodes to contact the bottom side of the substrate, the upper surface of the polycrystalline layer above the silicon dioxide, and the two second regions.

6. The process of claim 5 wherein the first conductivity type is p type and the second conductivity type is n type.

7. The process of claim 5 wherein the silicon dioxide is formed by a thermal oxidation of the underlying silicon layer.

8. The process of claim 5 wherein the silicon dioxide is formed by deposition.

9. The process of claim 5 wherein the hydrogenous ions are introduced into the silicon dioxide layer by annealing the intermediate structure in an atmosphere containing a hydrogenous gas.

10. The process of claim 5 wherein the hydrogenous ions are introduced into the silicon dioxide layer by ion implantation.

11. The process of claim 5 further comprising removing the silicon oxide layer except under the gate region in the polycrystalline silicon layer.

* * * * *